United States Patent [19]

Koike

[11] Patent Number: 5,392,242
[45] Date of Patent: Feb. 21, 1995

[54] SEMICONDUCTOR MEMORY DEVICE WITH SINGLE DATA LINE PAIR SHARED BETWEEN MEMORY CELL ARRAYS

[75] Inventor: Hiroki Koike, Tokyo, Japan

[73] Assignee: NEC Corporation, Tokyo, Japan

[21] Appl. No.: 70,669

[22] Filed: Jun. 2, 1993

[30] Foreign Application Priority Data

Jun. 4, 1992 [JP] Japan .................. 4-143879

[51] Int. Cl.[6] ................. G11C 7/00; G11C 11/34
[52] U.S. Cl. .................. 365/189.03; 365/189.01; 365/230.01; 365/230.03; 365/230.06; 365/230.08
[58] Field of Search ........... 365/230.03, 189.05, 365/189.03, 189.01, 230.01, 230.06, 230.08

[56] References Cited

U.S. PATENT DOCUMENTS

| 4,780,852 | 10/1988 | Kajigaya et al. | 365/203 |
|---|---|---|---|
| 4,855,957 | 8/1989 | Nagami | 365/230.03 |
| 4,899,310 | 2/1990 | Baba et al. | 365/189.05 |
| 4,931,994 | 6/1990 | Matsui et al. | 365/230.03 |
| 4,958,326 | 9/1990 | Sakurai | 365/230.03 |
| 5,014,246 | 5/1991 | Komatsu et al. | 365/230.03 |
| 5,166,900 | 11/1992 | Kondo | 365/63 |
| 5,243,558 | 9/1993 | Saeki | 365/182 |
| 5,272,677 | 12/1993 | Yamamura | 365/227 |

OTHER PUBLICATIONS

"A 256K Dynamic RAM with Page–Nibble Mode" by IEEE Journal of Solid-State Circuits, vol. SC-18, No. 5, Oct. 1983, pp. 470–477.

Primary Examiner—Viet Q. Nguyen
Attorney, Agent, or Firm—Sughrue, Mion, Zinn, Macpeak & Seas

[57] ABSTRACT

A dynamic random access memory device has a data line pair shared between a plurality of memory cell arrays, and a column address decoder unit allows one of column selectors to couple one of the associated bit line pairs with the shared data line pair so that the data line pair is not increased together with the memory capacity.

9 Claims, 9 Drawing Sheets

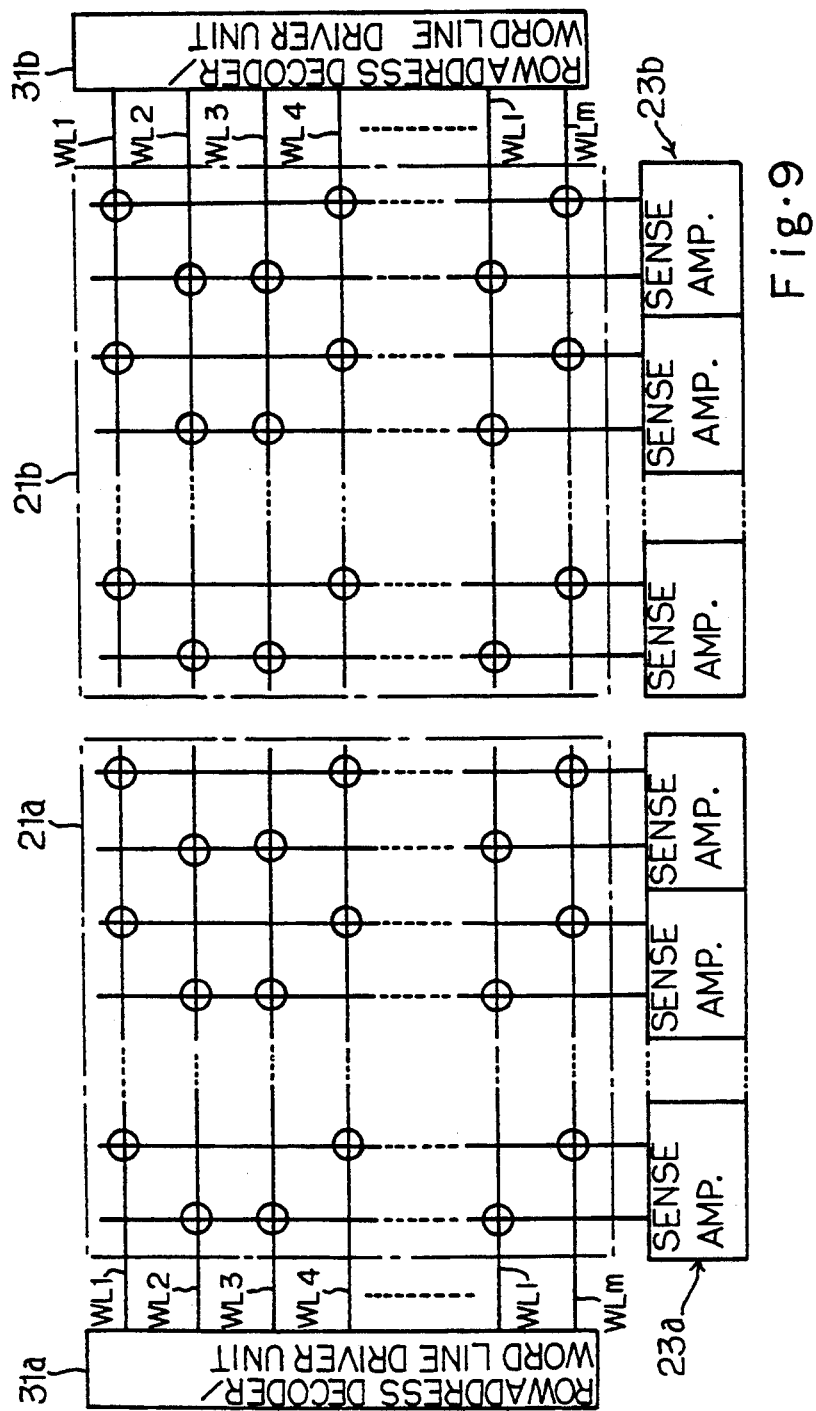

SEMICONDUCTOR MEMORY DEVICE WITH SINGLE DATA LINE PAIR SHARED BETWEEN MEMORY CELL ARRAYS

FIELD OF THE INVENTION

This invention relates to a semiconductor memory device and, more particularly, to a semiconductor memory device with a data line pair shared between all of the memory cell arrays.

DESCRIPTION OF THE RELATED ART

A typical example of the dynamic random access memory device is illustrated in FIG. 1 of the drawings, and largely comprises two memory cell arrays 1a and 1b, an addressing system 2, a data propagation system 3 and a controlling system 4.

The memory cell array 1 a consists of a plurality of memory cells MA11, MA1m, MA1n, MA21 , MA2m, MA2n, MA31, MA3m, MA3n, MA41, MA4m, MA4n, MAl1, MAlm, MAln, MAm1, MAmm and MAmn, and the plurality of memory cells MA11 to MAmn are arranged in rows and columns. Similarly, the memory cell array 1b is implemented by a matrix of memory cells MB11 to MBmn. Each of the memory cells MA11 to MAmn and MB11 to MBmn is implemented by a series combination of an n-channel enhancement type switching transistor Qn1 and a storage capacitor SC1, and each memory cell stores a data bit in the form of electric charges.

The addressing system 2 is broken down into a row addressing sub-system and a column addressing sub-system. The row addressing sub-system comprises a row address buffer unit (not shown), a row address decoder/word line driver unit 2a and a plurality of word lines WL1, WL2, WL3, WL4, ..., WLl and WLm, and the plurality of word lines WL1 to WLm are respectively associated with the rows of each of the memory cell arrays 1a and 1b. Row addresses are respectively assigned to the word lines WL1 to WLm. The row address buffer unit temporally stores a row address, and produces row address predecoded signals. The row address and, accordingly, the row address predecoded signals select one of the word lines WL1 to WLm. The row address decoder/word line driver unit 2a receives the row address predecoded signals, and drives the selected word line to an active high voltage level. However, the other word lines remain in an inactive low voltage level. The word lines WL1 to WLm are respectively connected to the gate electrodes of the n-channel enhancement type switching transistors Qn1 of the associated rows. Then, the selected word line allows the n-channel enhancement type switching transistors Qn1 of the associated row to turn on, and data are written into or read out from the storage capacitors SC1.

The column selecting sub-system comprises a column address decoder unit 2b and two column selector units 2c and 2d respectively associated with the two memory cell arrays 1a and 1b. The column selector units 2c and 2d are simultaneously activated by the column address decoder unit 2b, and carry out selecting operation on the associated memory cell arrays 1a and 1b.

The data propagation system 3 comprises two sets of bit line pairs BA1, BAm and BAn and BB1, BBm and BBn, two sense amplifier unit 3a and 3b, two pairs of data lines DA1 and DB1, two read-out circuits 3c and 3d and two write-in circuits 3e and 3f. Each of the bit line pairs BA1 to BAn and BB1 to BBn consists of right and left bit lines BLa and BLb, and the bit line pairs BA1 to BAn and BB1 to BBn are respectively associated with the columns of memory cells of the array 1a and the columns of memory cells of the array 1b. The right and left bit lines BLa and BLb of each bit line pair are selectively connected to the drain nodes of the n-channel enhancement type switching transistors Qn1 of the associated column, and each bit line pair propagates a data bit in the form of potential difference between the associated column selector unit 2c or 2d and the row of memory cells selected from the memory cell array 1a or 1b.

The sense amplifier units 3a and 3b are respectively associated with the memory cell arrays 1a and 1b, and comprise sense amplifier circuits SA1/SAm/SAn and SB1/SBm/SBn, respectively. The sense amplifier circuits SA1 to SAn and SB1 to SBn are connected to the bit line pairs BA1 to BAn and BB1 to BBn, and the column selector units 2c and 2d connect one of the bit line pairs SA1 to SAn and one of the bit line pairs SB1 to SBn to the pair of data lines DA1 and the pair of data lines DB1, respectively, under the control of the column address decoder unit 2b.

Namely, column addresses are respectively assigned to the columns of memory cells of each array. The column address is temporally stored in a column address buffer unit (not shown), and the column address buffer unit produces the column address predecoded signals from the column address bits. The column address decoder unit 2b receives the column address predecoded signals, and supplies two column address decoded signals to the column selector units 2c and 2d, respectively. Each of the column address decoded signals designates one of the column addresses, and causes the associated column selector unit 2c or 2d to select one of the bit line pairs BA1 to BAn or one of the bit line pairs BB1 to BBn.

As will be seen from FIG. 2 in detail, each of the sense amplifier circuits SA1 to SAn and SB1 to SBn comprises a first series combination of an n-channel enhancement type switching transistor Qn2 and a p-channel enhancement type switching transistor Qp3 and a second series combination of an n-channel enhancement type switching transistor Qn4 and a p-channel enhancement type switching transistor Qp5, and the first and second series combinations are coupled in parallel between power voltage lines SAN and SAP. Reference sign "SA" is commonly used for every sense amplifier circuit. The power voltage line SAP is pulled up to the positive power voltage level, the other power voltage line SAN is pulled down to the ground voltage level. The common drain nodes N1 and N2 are respectively coupled with the right and left bit lines BLa and BLb, and the common drain nodes N1 and N2 are respectively connected to the gate electrodes of the switching transistors Qn2 and Qp3 and to the gate electrodes of the switching transistors Qn4 and Qp5.

Each of the column selector units 2c and 2d is implemented by a plurality pairs of n-channel enhancement type switching transistors Qn6 and Qn7, and only one pair of n-channel enhancement type switching transistors Qn6 and Qn7 is shown and associated with the sense amplifier circuit SA. The n-channel enhancement type switching transistors Qn6 and Qn7 are respectively coupled between the right and left bit lines BLa and BLb and the associated pair of data lines DA1 or DB1. The column address decoded signal is supplied to the gate electrodes of the n-channel enhancement type switching transistors Qn6 and Qn7.

As described hereinbefore, data are propagated between the selected memory cells and the column selector units 2c and 2d in the form of potential difference, and are amplified by the sense amplifier circuits SA1 to SAn and SB1 to SBn. Namely, while the power voltage lines SAN and SAP supply the power voltage and the ground voltage to each sense amplifier circuit, the voltage levels at the common drain nodes N1 and N2 are rapidly amplified by the first and second series combinations. One of the column address decoded signals is assumed to be supplied to the gate electrodes of the n-channel enhancement type switching transistors Qn6 and Qn7, the n-channel enhancement type switching transistors Qn6 and Qn7 concurrently turn on, and transfer the amplified potential difference from the common drain nodes N1 and N2 to the associated data line pair DA1 or DB1.

The read-out circuits 3c and 3d receive the potential differences on the associated data line pairs DA1 and DB1, and produce an output data signal in a read-out operation. On the other hand, the write-in circuits 3e and 3f produce a potential difference from an input data signal, and supply the potential difference to one of the data line pairs DA1 and DB1 in a write-in operation.

The controlling system 4 comprises a timing generator (not shown) for producing internal timing control signals, switching units 4a and 4b and so fourth. The switching units 4a and 4b receive the write enable signal WE indicative of a write-in mode, and connect the data line pairs DA1 and DB1 to the write-in circuits 3h and 3i. Moreover, the switching units 4a and 4b connect the data line pairs DA1 and DB1 to the read-out circuits 3f and 3g when the write enable signal WE is disabled. Thus, each data line pair DA1 or DB1 is associated with a set of write-in and read-out circuits 3c/3d or 3e/3f, and switching unit 4a or 4b selectively connects the data line pair DA1 or DB1 to the associated write-in and read-out circuits 3f/3h or 3g/3i. The switching units 4a and 4b or the write-in and read-out circuits 3c to 3f may be selectively enabled depending upon the accessed memory cell array 1a or 1b.

The arrangement of the data input/output facility shown in FIG. 1 is uneconomical, because the data line pairs DA1 and DB1 require the same number of the switching units 4a and 4b. In order to simplify the circuit arrangement, switching units 14a and 14b are serially connected as shown in FIG. 3, and a pair of write-in and read-out circuits 15a and 15b is shared between all of the data line pairs DA1 and DB1. The prior art dynamic random access memory device shown in FIG. 3 is similar to that shown in FIG. 1 except for the shared write-in and read-out circuits 15a and 15b as well as the series of switching units 14a and 14b, and the other components are labeled with the same references designating corresponding components without detailed description.

The switching unit 14a is responsive to, for example, a block decoded signal BL indicative of either memory cell array 1a or 1b, and the switching unit 14b is responsive to the write enable signal WE. The switching units 14a and 14b couples one of the data line pairs DA1 and DB1 with either write-in or read-out circuit 15a or 15b depending upon combination of the block selecting signal BL and the write enable signal WE.

As described hereinbefore, the prior art dynamic random access memory device shown in FIG. 1 requires the plurality pairs of data lines DA1 and DB1 respectively associated with the memory cell arrays 1a and 1b, and these data line pairs DA1 and DB1 increase as the memory cell arrays 1a and 1b or the memory capacity becomes larger. The write-in and read-out circuits 3c/3e and 3d/3f increase with the data line paris DA1 and DB1. This results in that the semiconductor chip is non-lineally enlarged as the memory capacity becomes larger, and, accordingly, the prior art dynamic random access memory device shown in FIG. 1 suffers from low production yield.

On the other hand, the prior art dynamic random access memory device shown in FIG. 3 is smaller in rate of increase than the prior art dynamic random access memory device shown in FIG. 1, because only one pair of write-in and read-out circuits is shared between all of the data line pairs DA1 and DB1. However, the memory cell arrays 1a and 1b still require their own data line pairs DA1 and DB1, and the data line pairs DA1 and DB1 increase as the memory cell arrays DA1 and DB1 becomes larger. Moreover, the switching units 14a and 14b require more complex control signals.

SUMMARY OF THE INVENTION

It is therefore an important object of the present invention to provide a semiconductor memory device which has a small amount of chip area without complex control signals.

To accomplish the object, the present invention proposes to introduce a plurality of column selecting means to connect one of data propagation paths to a data line pair so that the data line pair is shared between a plurality of memory cell arrays.

In accordance with the present invention, there is provided a semiconductor memory device comprising: a) a plurality of memory cell arrays assigned respective block addresses, and each having a plurality of addressable memory cells respectively assigned row addresses and column addresses, the row addresses and the column addresses being shared between the plurality of memory cell arrays; b) a row addressing means responsive to first address bits for selecting rows of memory cells from the respective memory cell arrays; c) a plurality sets of data propagation paths respectively coupled with the plurality of memory cell arrays for propagating data bits; d) a data line pair shared between the plurality of memory cell arrays; e) a column address decoder means responsive to second address bits for selecting one of the data propagation paths incorporated in the plurality sets of data propagation paths; f) a plurality of column selecting means respectively coupled between the plurality sets of data propagation paths and the data line pair, and operative to couple the aforesaid one of the data propagation paths with the data line pair under the control of the column address decoder means; g) a read-out circuit for producing an output data signal from one of the data bits; h) a write-in circuit for producing one of the data bits from an input data signal; and i) a switching means operative to couple the data line pair with one of the read-out circuit and the write-in circuit.

BRIEF DESCRIPTION OF THE DRAWINGS

The features and advantages of the semiconductor memory device according to the present invention will be more clearly understood from the following description taken in conjunction with the accompanying drawings in which:

FIG. 9 is a block diagram showing the arrangement of still another dynamic random access memory device according to the present invention.

DESCRIPTION OF THE PREFERRED EMBODIMENTS

First Embodiment

Figures 1A, 1B:
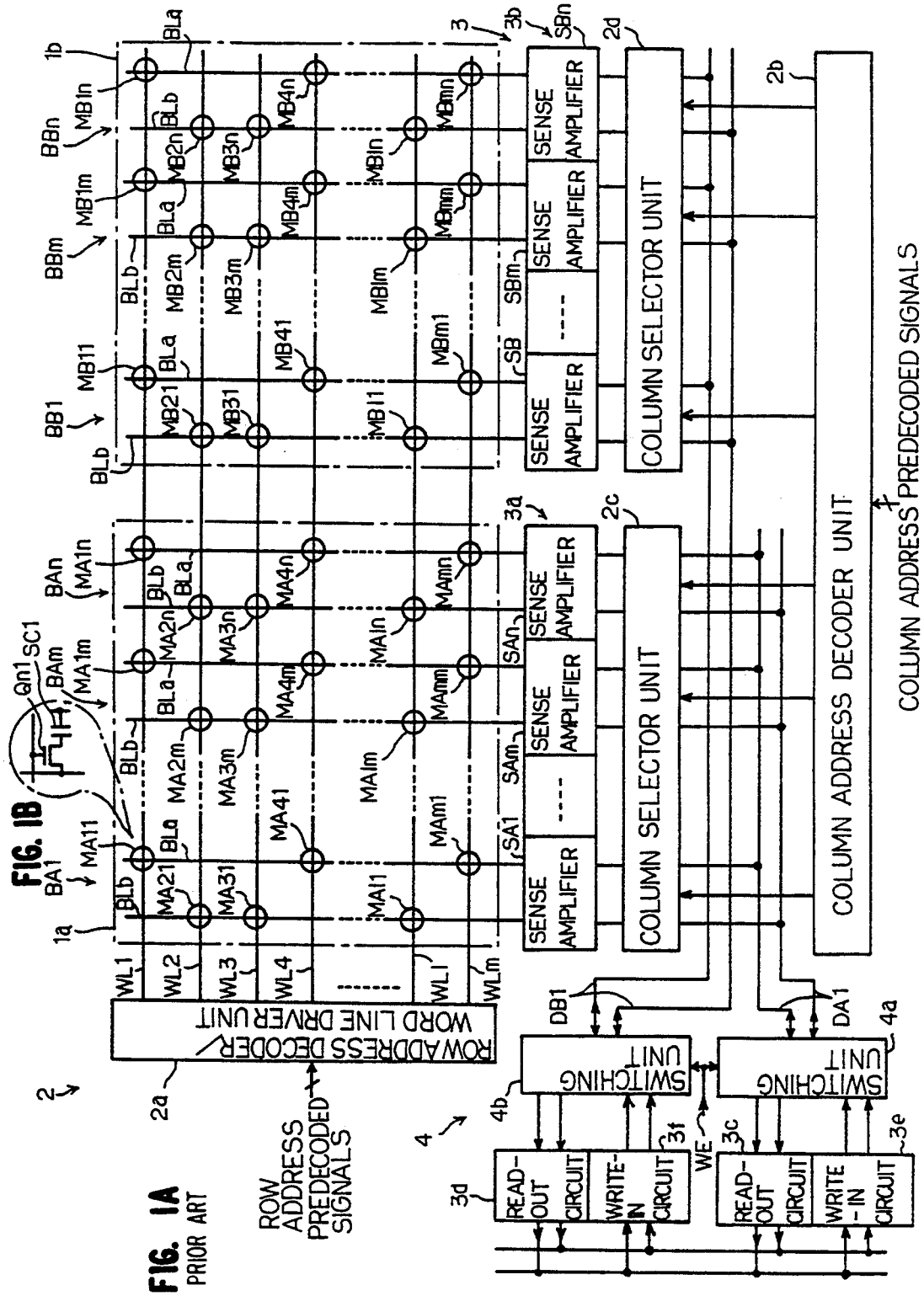
FIG. 1 is a block diagram showing the arrangement of the prior art dynamic random access memory device.
Figure 2:
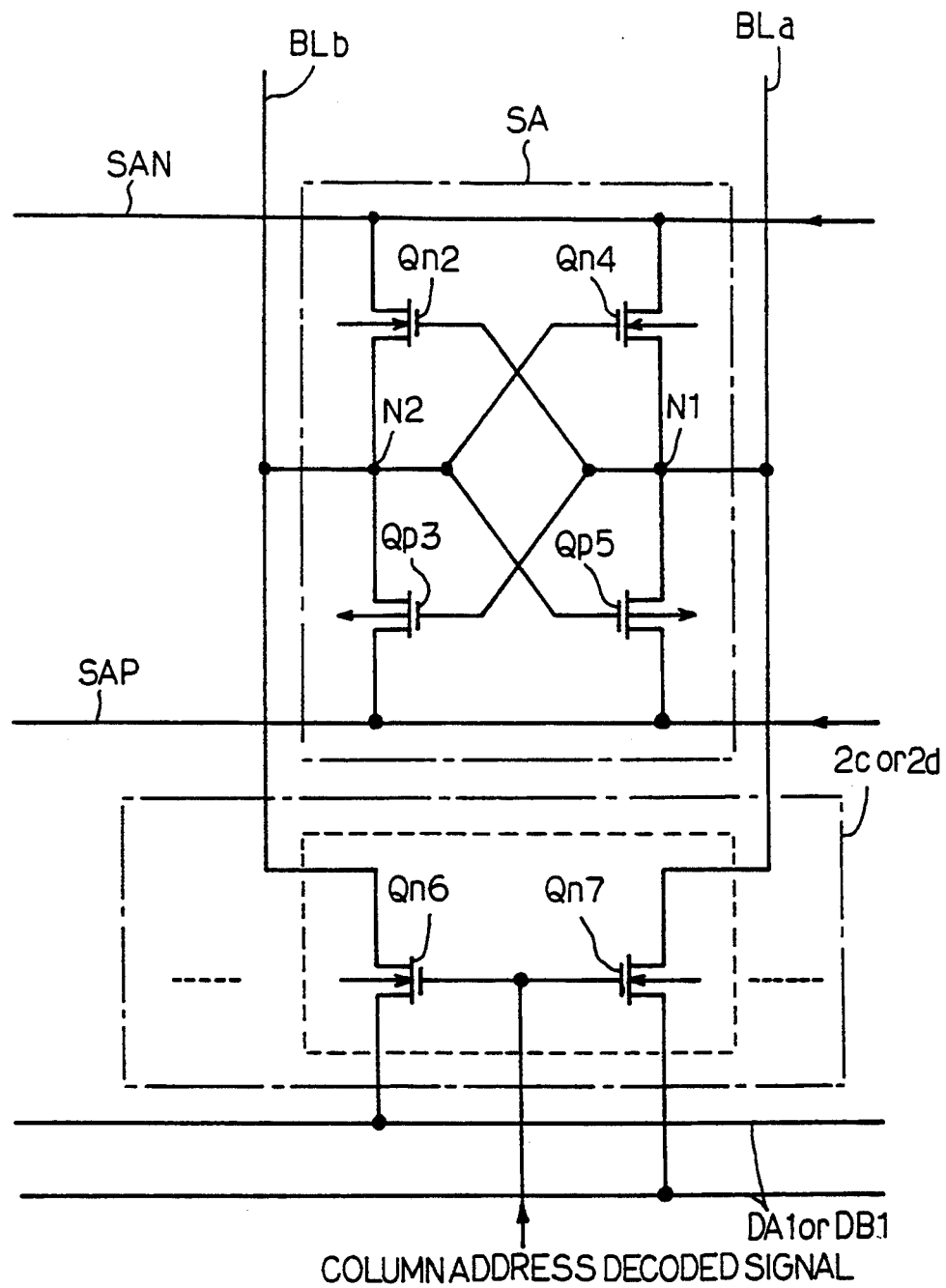
FIG. 2 is a circuit diagram showing the arrangement of the sense amplifier circuit and the column selector incorporated in the prior art dynamic random access memory device.
Figure 3:
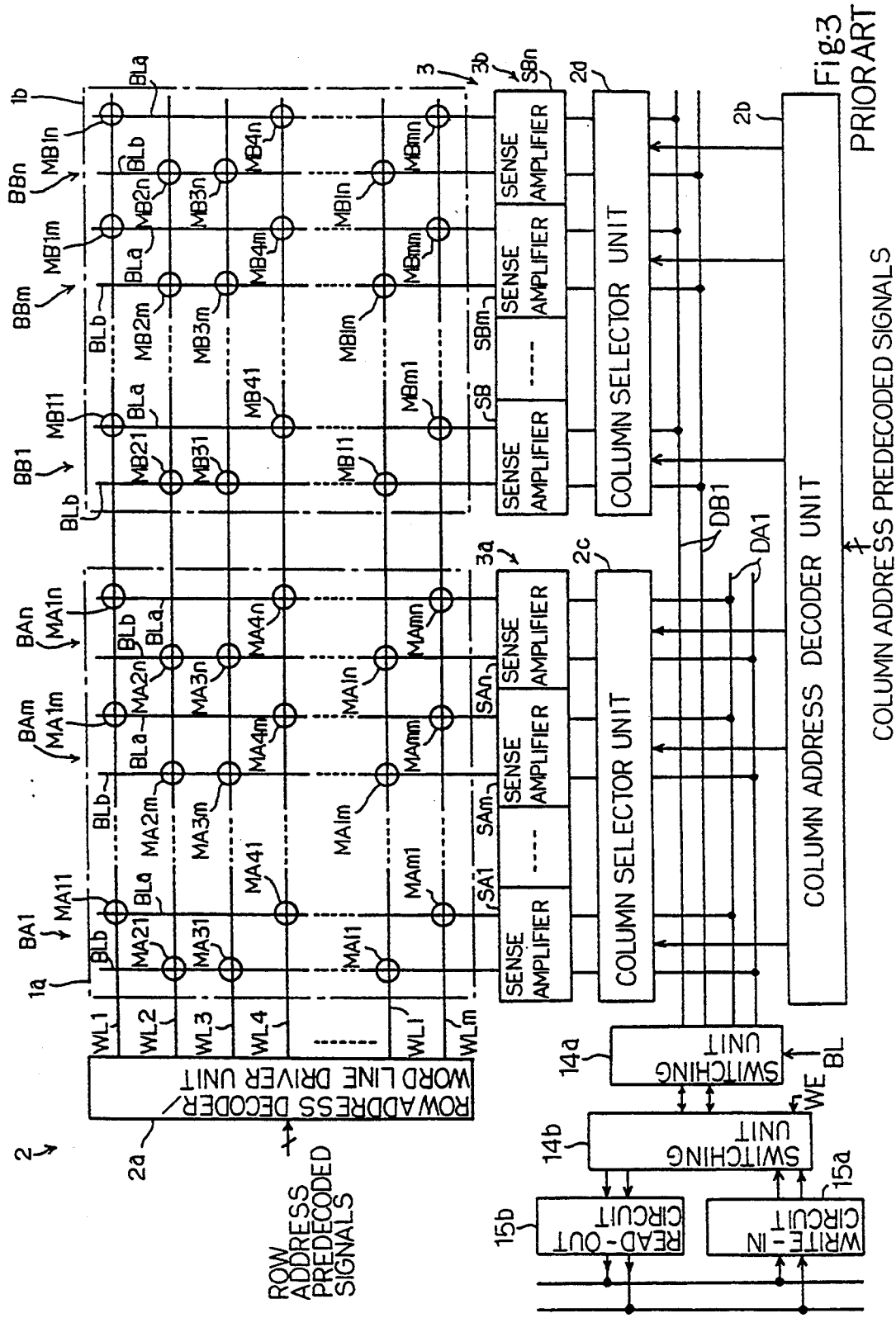
FIG. 3 is a block diagram showing the arrangement of the other prior art dynamic random access memory device.
Figure 4:
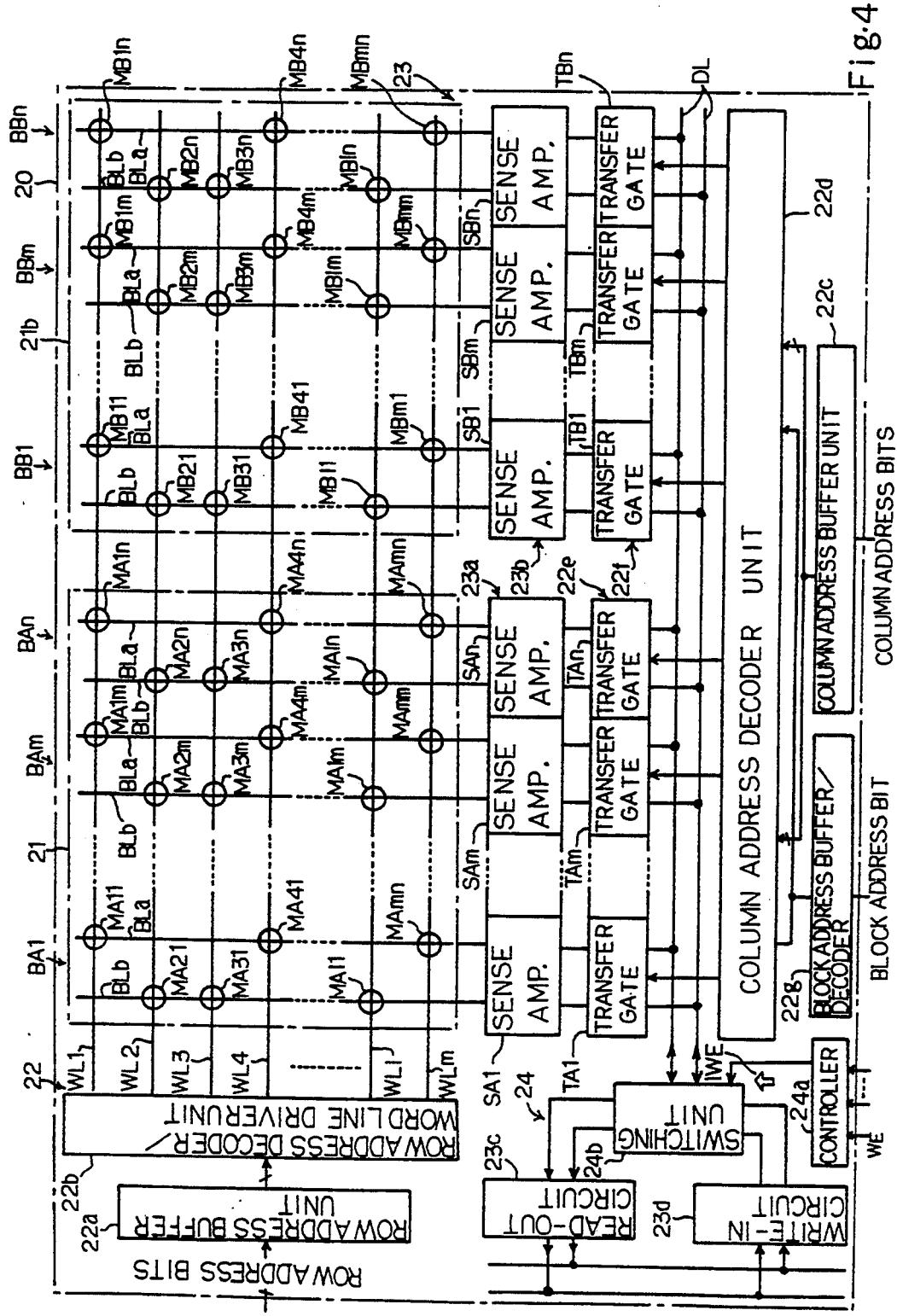
FIG. 4 is a block diagram showing the arrangement of a dynamic random access memory device according to the present invention.

Referring to FIG. 4 of the drawings, a dynamic random access memory device embodying the present invention is fabricated on a single semiconductor chip 20, and largely comprises a plurality of memory cell arrays 21a and 21b, an addressing system 22, a data propagation system 23 and a controlling system 24 as similar to the prior art dynamic random access memory device.

The memory cell array 21a consists of a plurality of memory cells MA11, MA1m, MA1n, MA21, MA2m, MA2n, MA31, MA3m, MA3n, MA41, MA4m, MA4n, MAl1, MAlm, MAln, MAm1, MAmm and MAmn, and the plurality of memory cells MA11 to MAmn are arranged in rows and columns. As similar to the memory cell array 21a, the memory cell array 21b is implemented by a matrix of memory cells MB11 to MBmn. Each of the memory cells MA11 to MAmn and MB11 to MBmn is implemented by a series combination of an n-channel enhancement type switching transistor and a storage capacitor as similar to the prior art memory cell, and each memory cell stores a data bit in the form of electric charges. Block addresses are assigned to the memory cell arrays 21a and 21b, and either memory cell array 21a or 21b is selected with a block address bit at every access.

The addressing system 22 is broken down into a row addressing sub-system, a column addressing sub-system and a block selecting sub-system. The row addressing sub-system comprises a row address buffer unit 22a, a row address decoder/word line driver unit 22b and a plurality of word lines WL1, WL2, WL3, WL4, . . . , WL1 and WLm, and the plurality of word lines WL1 to WLm are shared between the memory cell arrays 21a and 21b. Row addresses are respectively assigned to the word lines WL1 to WLm and to the rows of memory cells, and the row addresses are shared between the memory cell arrays 21a and 21b. Namely, the rows of memory cells MA11 to MAmn are respectively corresponding to the rows of memory cells MB11 to MBmn, and each row address identifies not only one of the rows of memory cells MA11 to MAmn but also one of the memory cells MB11 to MBmn.

The row address buffer unit 22a temporally stores the row address bits, and produces row address predecoded signals. The row address predecoded signals are supplied to the row address decoder/word line driver unit 22b, and the row address decoder/word line driver unit 22b selects one of the word lines WL1 to WLm with the row address indicated by the row address bits. When one of the word lines WL1 to WLm is selected, the row address decoder/word line driver unit 22b drives the selected word line to an active high voltage level. However, the other word lines remain in an inactive low voltage level. The word lines WL1 to WLm are respectively coupled with the gate electrodes of the n-channel enhancement type switching transistors of the memory cells in the associated rows. Then, the selected word line allows the n-channel enhancement type switching transistors of the associated rows to turn on, and data bits are written into or read out from the storage capacitors.

The column selecting sub-system comprises a column address buffer unit 22c, a column address decoder unit 22d and two column selector units 22e and 22f respectively associated with the two memory cell arrays 21a and 21b. Column addresses are respectively assigned to the columns of memory cells of each memory cell array 21a or 21b. The column address buffer unit 22c temporally stores column address bits, and produces column address predecoded signals. The column address decoder unit 22d is responsive to the column address predecoded signals, and produces a column address decoded signal. The column selector units 22e and 22f respectively comprise transfer gates TA1 to TAn and transfer gates TB1 to TBn, and the transfer gates TA1 to TAn and TB1 to TBn are provided in association with the columns of the memory cell array 21a and the columns of the memory cell array 21b, respectively. The transfer gates TA1 to TAn and TB1 to TBn are similar in arrangement to the prior art, and each transfer gate is implemented by a pair of n-channel enhancement type switching transistors.

The block selecting sub-system comprises a block address buffer/decoder unit 22g, and the block address buffer/decoder unit 22g is responsive to a block address bit indicative of the block address assigned to the memory cell array either 21a or 21b for producing a block enable signal EBL1. The block enable signal EBL1 is supplied to the column address decoder unit 22d, and allows the column address decoder unit 22d to produce a single column address decoded signal as will be understood from description below.

Figure 5:
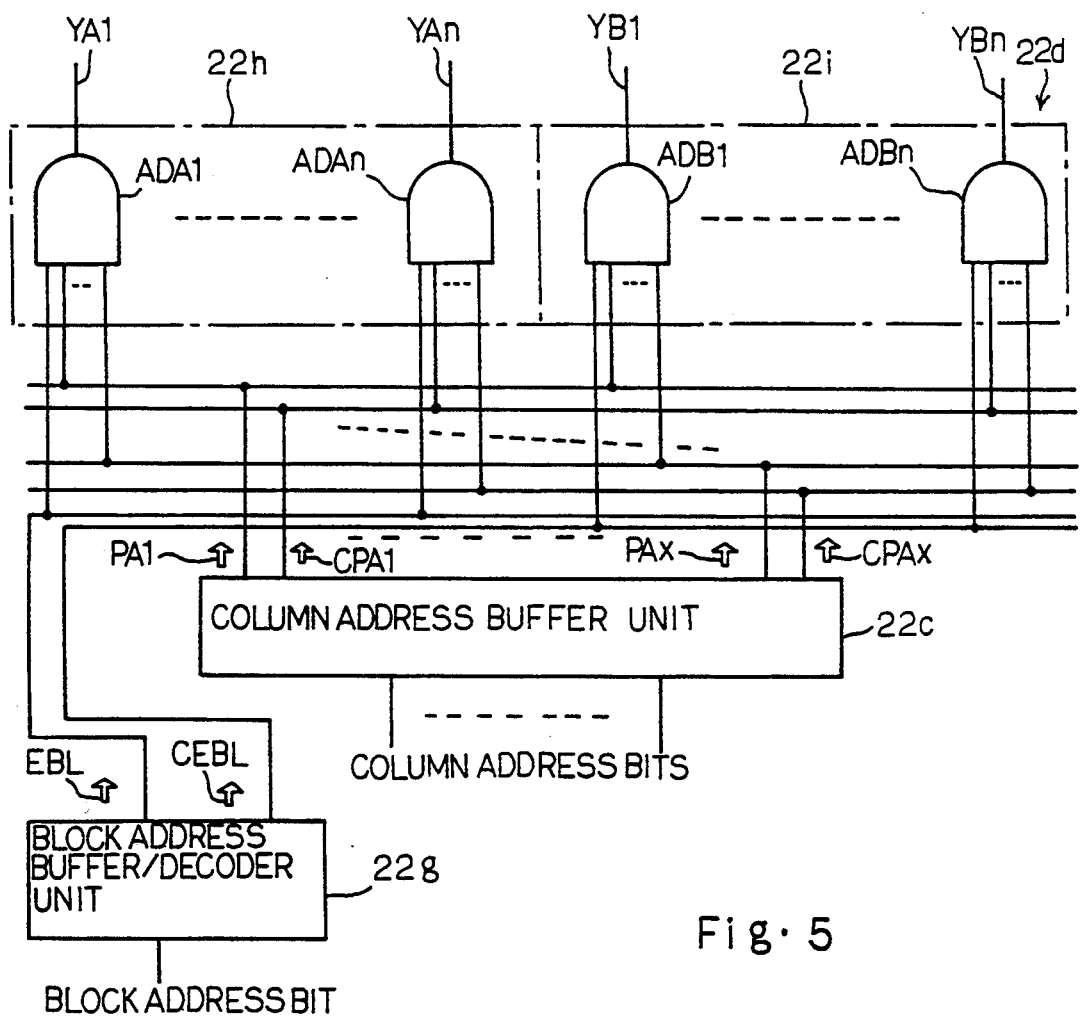
FIG. 5 is a logic diagram showing the arrangement of a column address decoder unit incorporated in the dynamic random access memory device according to the present invention.

The column address decoder unit 22d is arranged as shown in FIG. 5, and the column address predecoded signals, the block address decoded signal and the complementary block address decoded signal are respectively labeled with "PA1" to "PAx"/"CPA1" to "CPAx", "EBL" and "CEBL". The column address predecoded signals CPA1 to CPAx are complementary to the column address predecoded signals PA1 to PAx. The column address decoder unit 22d is broken down into two sections 22h and 22i, and the sections 22h and 22i are implemented by an array of AND gates ADA1 to ADAn and an array of AND gates ADB1 to ADBn, respectively. The AND gates ADA1 to ADAn and the AND gates ADB1 to ADBn are respectively coupled through decoded signal lines YA1 to YAn and YB1 to YBn with the transfer gates TA1 to TAn and TB1 to TBn, and one of the decoded signal lines YA1 to YAn and YB1 to YBn propagates the column address decoded signal.

The column address predecoded signals PA1 to PAx and CPA1 to CPAx are selectively supplied to the AND gates ADA1 to ADAn as well as to the AND gates ADB1 to ADBn, and distribution of the column address predecoded signals PA1 to PAx and CPA1 to CPAx to the section 22h is identical with that to the section 22i. For example, the column address predecoded signals PA1 to PAx are supplied to the AND gate ADA1, and the corresponding AND gate ADB1 is supplied with the column address predecoded signals PA1 to PAx. Similarly, the column address predecoded signals CPA1 to CPAx are distributed to not only the AND gate ADAn but also the AND gate ADBn. For this reason, the column address predecoded signals of logic "1" level are supplied to two AND gates.

However, the block address decoded signal EBL and the complementary block address decoded signals CEBL are respectively supplied to the sections 22h and 22i, and either array of AND gates ADA1 to ADAn or ADB1 to ADBn is enabled. As a result, one of the two selected AND gates produces the column address decoded signal.

Turning back to FIG. 4, the data propagation system 23 comprises two sets of bit line pairs BA1, BAm and BAn and BB1, BBm and BBn, two sense amplifier unit 23a and 23b, a pair of data lines DL, a single read-out circuits 23c and a single write-in circuit 23d. Each of the bit line pairs BA1 to BAn and BB1 to BBn consists of right and left bit lines BLa and BLb, and the bit line pairs BA1 to BAn and BB1 to BBn are respectively associated with the columns of memory cells of the array 1a and the columns of memory cells of the array 1b. The right and left bit lines BLa and BLb of each bit line pair are selectively coupled with the drain nodes of the n-channel enhancement type switching transistors Qn1 of the associated column, and each bit line pair propagates a data bit in the form of potential difference between the associated column selector unit 22e or 22f and the row of memory cells selected from the memory cell array 21a or 21b. Thus, the bit line pairs BA1 to BAn and BB1 to BBn serve as a plurality sets of data propagation paths.

The sense amplifier units 23a and 23b are respectively associated with the memory cell arrays 21a and 21b, and comprise sense amplifier circuits SA1/SAm/SAn and SB1/SBm/SBn, respectively. The sense amplifier circuits SA1 to SAn and SB1 to SBn are coupled with the bit line pairs BA1 to BAn and BB1 to BBn, and the column selector units 2c and 2d couple one of the bit line pairs SA1 to SAn and SB1 to SBn with the pair of data lines DL under the control of the column address decoder unit 22d.

The read-out circuit 23c is responsive to the developed potential difference on the data line pair DL, and produces an output data signal. On the other hand, the write-in circuits 23d produces a potential difference from an input data signal, and supply the potential difference to the data line pair DL.

The controlling system 24 comprises a controller 24a responsive to external control signals and a switching unit 24b. The controller 24a not only sequentially produces timing control signals (not shown) but also shifts the dynamic random access memory device between a write-in mode, a read-out mode and a refreshing mode. One of the external control signals WE is indicative of the operation mode, and the controller 24a produces a mode control signal IWE indicative of either write-in or read-out mode from the external control signal WE. The switching unit 24b is responsive to the mode control signal IWE, and selectively couples the data line pair DL with the read-out circuit 23c and the write-in circuit 23d depending upon the logic level of the mode control signal IWE.

A read-out sequence and a write-in sequence are briefly described hereinbelow. Assuming now that the block, row and column address bits select the memory cell MA11, a precharging circuit (not shown) firstly equalizes the right and left bit lines BLa and BLb of all the bit line pairs BA1 to BAn and BB1 to BBn at an intermediate voltage level between a positive power voltage level and a ground voltage level. If the mode control signal IWE instructs the dynamic random access memory device the readout operation, the row address decoder/word line driver unit 22b drives the word line WL1 over the positive power voltage level, and the right bit lines BLa are coupled with the storage capacitors of the memory cells MA11 to MA1n and MB11 to MB1n. The voltage levels on the right bit lines BLa slightly go up or down depending upon the data bits stored therein, and small potential differences take place on the bit line pairs BA1 to BAn and BB1 to BBn, respectively. The bit line pairs BA1 to BAn and BB1 to BBn propagate the small potential differences to the sense amplifier circuits SA1 to SAn and SB1 to SBn, and the small potential differences are developed by the sense amplifier circuits SA1 to SAn and SB1 to SBn.

The block address buffer/decoder unit 22g shifts the block address decoded signal EBL to a positive high voltage level corresponding to logic "1" level, and the second 22h is enabled. The column address buffer unit 22c shifts the column address predecoded signals PA1 to PAx to logic "1" level, and only the AND gate ADA1 shifts the decoded signal line YA1 to logic "1" level or the positive high voltage level.

With the column address decoded signal on the decoded signal line YA1, the transfer gate TA1 turns on, and transfers the potential difference to the data line pair DL. The mode control signal IWE causes the switching unit 24b to couple the data line pair DL with the read-out circuit 23c. As a result, the potential difference on the data line pair DL reaches the read-out circuit 23c, and the read-out circuit 23c produces the output data signal from the potential difference.

On the other hand, when the mode control signal IWE is indicative of the write-in operation, the write-in circuit 23d produces a potential difference from the input data signal, and the switching unit 24b have couples the write-in circuit 23d with the data line pair DL. Therefore, the potential difference is transferred to the data line pair DL, and the transfer gate TA1 in turn transfers the potential difference to the bit line pair BA1.

The row address decoder/word line driver unit 22b drives the word line WL1 over the positive high voltage level. The potential difference on the data line pair DL is transferred through the transfer gate TA1 to the bit line pair BA1, and the data bit represented by the potential difference is developed and stored in the memory cell MA11. The other potential differences on the other bit line pairs are restored in the other memory cells again.

As will be appreciated from the foregoing description, the random access memory device according to the present invention has only one data line pair DL, and the data line pair DL is shared between all of the memory cell arrays 21a and 21b. Even if the number of memory cell arrays were increased, it could be possible that only one data line pair selectively propagates a data bit for any one of the memory cell arrays, and the rate of increase is smaller than those of the prior art dynamic random access memory devices. Moreover, the switching unit 24b only couples the data line pair DL with one of the read-out and write-in circuits 23c and 23d, and the selection between the read-out circuit 23c and the write-in circuit 23d is simple. Thus, the dynamic random access memory device according to the present invention is fabricated on a small-sized semiconductor chip without sacrifice of simple control of the switching unit 24b.

Second Embodiment

Figure 6:
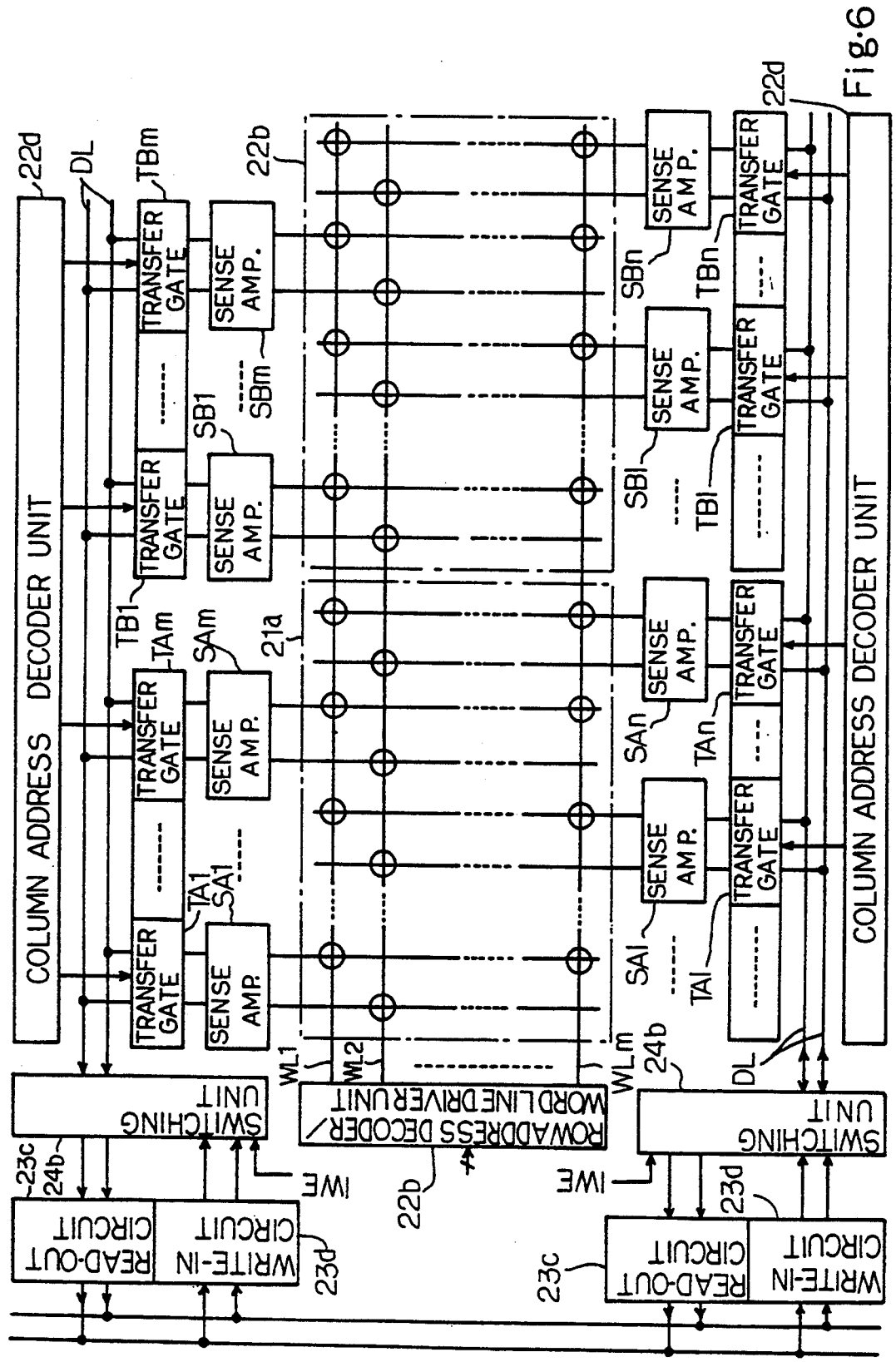
FIG. 6 is a block diagram showing the arrangement of another dynamic random access memory device according to the present invention.

Turning to FIG. 6 of the drawings, another dynamic random access memory device embodying the present invention is equipped with shared type sense amplifier circuits. The sense amplifier circuits SA1 to SAn and the sense amplifier circuits SB1 to SBn are selectively located on both sides of the memory cell arrays 21a and 21b, and the column selector units are split into two sections, and the transfer gates TA1 to TAn and TB1 to TBn are also located on both sides of the memory cell arrays 21a and 21b.

Accordingly, the data line pair DL, the column address decoder unit 22d, the switching unit 24b, the read-out circuit 23c and the write-in circuit 23d are doubled. However, the doubled data line pair DL is still shared between the memory cell arrays 21a and 21b, and the column address decoder unit 22d allows one of the transfer gates TA1 to TAn and TB1 to TBn to transfer a potential difference to the doubled data line pair DL.

Other components are similar to those of the first embodiment, and read-out and write-in sequences are similar to those of the first embodiment. For this reason, no further description is incorporated hereinbelow for avoiding undesirable repetition.

The dynamic random access memory device shown in FIG. 6 similarly achieves the same advantages as the first embodiment.

Third Embodiment

Figure 7:
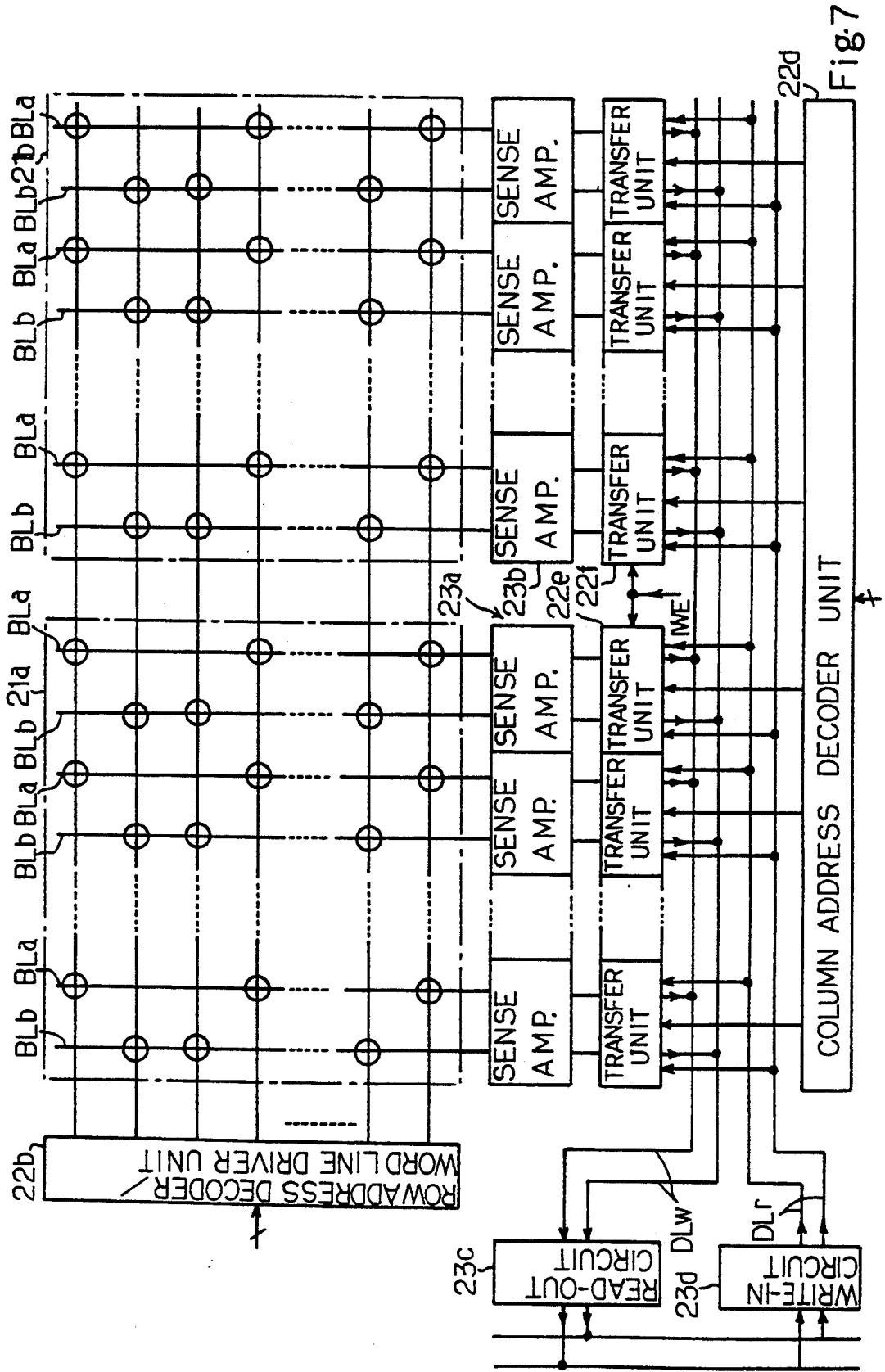
FIG. 7 is a block diagram showing the arrangement of yet another dynamic random access memory device according to the present invention.

Turning to FIG. 7 of the drawings, yet another dynamic random access memory device embodying the present invention is equipped with a read-out data line pair DLr and a write-in data line pair DLw. The read-out data line pair DLr and the write-in data line pair DLw are exclusively used by the read-out circuit 23c and the write-in circuit 23d, and any switching unit is not incorporated therein. The mode control signal IWE is directly supplied to the column selector units 22e and 22f, and the column selector units 22e and 22f selectively couples a selected bit line pair with the read-out and write-in data line pairs DLr and DLw. However, the other components are similar to those of the first embodiment, and description thereon is omitted for the sake of simplicity.

Figure 8:
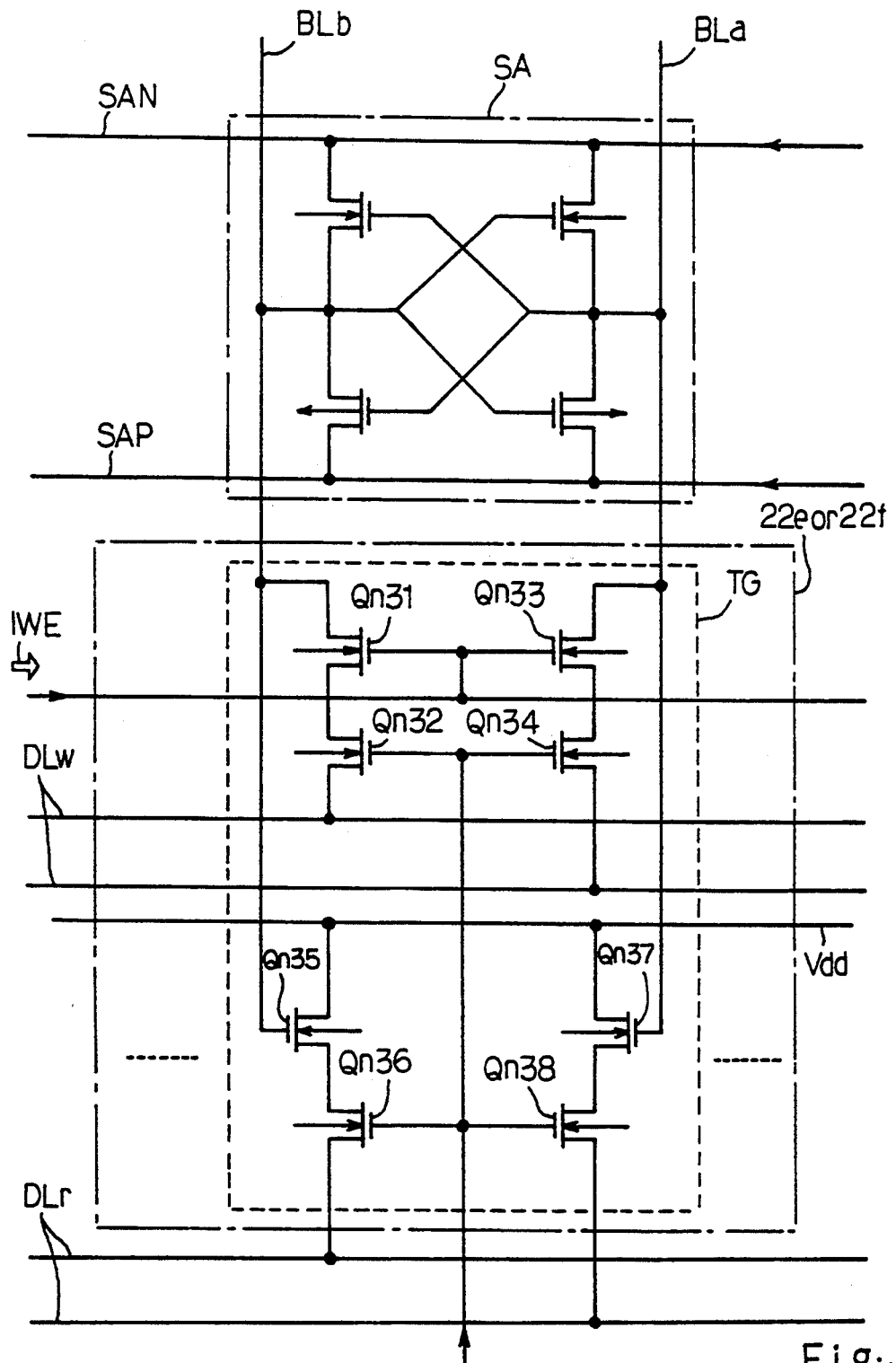
FIG. 8 is a circuit diagram showing a part of a column selector unit incorporated in the yet another dynamic random access memory device.

FIG. 8 illustrates one of the transfer units TG of the column selector units 22e and 22f associated with one of the sense amplifier circuits SA. The transfer unit TG comprises two series combination of n-channel enhancement type switching transistors Qn31/ Qn32 and Qn33/ Qn34 coupled between the associated bit line pair Bla and BLb and the write-in data line pair DLw, and two series combinations of n-channel enhancement type switching transistors Qn35/Qn36 and Qn37/Qn38 coupled between a positive power voltage line Vdd and the read-out data line pair DLr. The mode control signal IWE is applied to the gate electrodes of the switching transistors Qn31 and Qn33, and the bit lines BLa and BLb are coupled with the gate electrodes of the n-channel enhancement type switching transistors Qn37 and Qn35, respectively.

In the write-in mode, the mode control signal IWE goes up to positive high voltage level, and a potential difference on the write-in data line pair DLw is transferred to the bit lines BLa and BLb. In the read-out mode, the mode control signal IWE remains in ground voltage level, and a potential difference on the bit lines BLa and BLb causes the n-channel enhancement type switching transistors Qn35 and Qn37 to complementarily turn on and off. Then, positive power voltage level is supplied to one of the read-out data lines, and the other read-out data line is grounded. As a result, the potential difference is transferred to the read-out data line pair DLr.

The read-out and write-in sequences are similar to those of the first embodiment, and the third embodiment also achieves the same advantages, because the read-out data line pair DLr and the write-in data line pair DLw are not increased with the memory capacity.

In this instance, one data line pair is increased instead of the switching unit. However, the data line pair occupies smaller amount of real estate rather than the switching unit, and the semiconductor chip size is decreased.

Fourth Embodiment

Turning to FIG. 9 of the drawings, still another dynamic random access memory device embodying the present invention is illustrated. The dynamic random access memory device shown in FIG. 9 is similar to the first embodiment except for row address decoder/word line driver units 31a and 31b exclusively used for the memory cell arrays 21a and 21b. With the two row address decoder/word line driver units 31a and 31b, two different rows are addressable, and a combination of the second embodiment allows two data bits to be read out from two memory cells with different row addresses to the doubled data line pair DL.

Although particular embodiments of the present invention have been shown and described, it will be obvious to those skilled in the art that various changes and modifications may be made without departing from the spirit and scope of the present invention. For example, more than two memory cell arrays 21a and 21b may be incorporated in another dynamic random access memory device according to the present invention, and the present invention is applicable to any type of semiconductor memory device. The dynamic random access memory device may be incorporated in a large scale integration together with other function blocks.

What is claimed is:

1. A semiconductor memory device comprising:
   a) a plurality of memory cell arrays having respective block addresses, and each having a plurality of addressable memory cells having respective row addresses and respective column addresses, said row addresses and said column addresses being shared between said plurality of memory cell arrays;

b) a row addressing means responsive to first address bits for selecting rows of memory cells from said respective memory cell arrays;

c) a plurality sets of data propagation paths respectively coupled with said plurality of memory cell arrays for propagating data bits;

d) a data line pair shared between said plurality of memory cell arrays;

e) a column address decoder means responsive to second address bits for selecting one of the data propagation paths incorporated in said plurality sets of data propagation paths;

f) a plurality of column selecting means respectively coupled between said plurality sets of data propagation paths and said data line pair, and operative to couple said one of said data propagation paths with said data line pair under the control of said column address decoder means;

g) a read-out circuit for producing an output data signal from one of said data bits;

h) a write-in circuit for producing one of said data bits from an input data signal; and i) a switching-means operative to couple said data line pair with one of said read-out circuit and said write-in circuit.

2. A semiconductor memory device as set forth in claim 1, in which said row addressing means is implemented by a single row address decoder means shared between said plurality of memory cell arrays.

3. A semiconductor memory device as set forth in claim 2, in which said data propagation paths are respectively implemented by a plurality of bit line pairs for propagating potential differences to said plurality of column selecting means.

4. A semiconductor memory device as set forth in claim 3, in which further comprising a plurality of sense amplifier units respectively associated with said plurality of memory cell arrays, and having a plurality sets of sense amplifier circuits respectively coupled with said plurality of bit line pairs.

5. A semiconductor memory device as set forth in claim 4, in which all of the sense amplifier circuits of each sense amplifier unit is located on a predetermined side of the associated memory cell array.

6. A semiconductor memory device as set forth in claim 4, in which the sense amplifier circuits of each sense amplifier unit are selectively located on both sides of the associated memory cell array, and each of said plurality of column selecting means is divided into two selector sections coupled with said sense amplifier circuits selectively located on both sides of said associated memory cell array, said data line pair being divided into two data line sections respectively coupled with said two selector sections.

7. A semiconductor memory device as set forth in claim 1, in which said data line pair is used in both read-out and write-in operation.

8. A semiconductor memory device as set forth in claim 1, in which said data line pair has read-out lines exclusively used in a read-out operation and write-in lines exclusively used in a write-in operation, said switching means being incorporated in each of said plurality of column selecting means.

9. A semiconductor memory device as set forth in claim 1, in which said row addressing means have a plurality of row address decoder means respectively associated with said plurality of memory cell arrays.

* * * * *